United States Patent [19]

Schoen, Jr.

[11] Patent Number: 4,674,074

[45] Date of Patent: Jun. 16, 1987

[54] SATURATED VAPOR PRESSURE RELEASE MECHANISM

[76] Inventor: Oscar W. Schoen, Jr., P.O. Box 408, Organ, N. Mex. 88052

[21] Appl. No.: 663,787

[22] Filed: Oct. 23, 1984

[51] Int. Cl.[4] .......................... H04R 1/44; H05K 5/00

[52] U.S. Cl. .................................... 367/172; 367/171; 367/167

[58] Field of Search ............... 367/158, 166, 167, 171, 367/172; 181/402; 310/237, 343

[56] References Cited

U.S. PATENT DOCUMENTS

| | | | |
|---|---|---|---|
| 2,417,426 | 3/1947 | Mason | 367/166 |
| 2,435,595 | 2/1948 | Mason | 367/166 |
| 3,539,980 | 11/1970 | Massa, Jr. | 367/158 |
| 3,541,502 | 11/1970 | Behrendt et al. | 367/158 |
| 3,854,116 | 11/1974 | Toulis et al. | 181/402 |
| 4,450,929 | 5/1984 | Marrs | 181/151 |

*Primary Examiner*—Nelson Moskowitz
*Attorney, Agent, or Firm*—Saul Elbaum; Alan J. Kennedy; Thomas E. McDonald

[57] ABSTRACT

A mechanism for compensating an underwater transducer for the ambient hydrostatic pressure. The transducer housing includes a quantity of liquid which may be vaporized in the housing volume. The relative volumes of vapor and liquid depend on the temperature, pressure and type of liquid used. A small heater in the liquid increases the temperature of the liquid so that the pressure of the vapor increases and counteracts the increase in hydrostatic pressure at greater depths. The liquid chosen should have a high critical pressure relative to the operating pressure of the transducer.

10 Claims, 2 Drawing Figures

SATURATED VAPOR PRESSURE RELEASE MECHANISM

BACKGROUND OF THE INVENTION

1. Field of the Invention

This invention relates generally to a transducer pressure release system and more particularly to a deep underwater acoustic transducer with a system for releasing pressure including a saturated liquid/vapor volume with a temperature control.

2. Description of the Prior Art

When acoustic transducer have been exposed to extreme static pressure at great depths, it has been general practice to employ various pressure release techniques to maintain the efficiency of the transducer. The pressure release prevents the ambient hydrostatic pressure from compressing the transducer and altering its operating characteristics.

One type of pressure release includes a gas medium such as air within the housing and in contact with the radiating mass. The gas pressure is changed according to the ambient hydrostatic pressure to provide necessary stiffness. Unfortunatly, this system requires a complicated rig of gas bottles, cross-over valves and relief valves creating complex hardware problems and danger in handling a transducer housing under high pressure.

Another technique uses solid material containing air pockets such as foam rubber or plastic. This is unsatisfactory at great depths since these materials collapse under extreme pressure.

A third technique using coupled magnetic fields is shown in U.S. Pat. No. 3,790,928. The interacting magnetic fields produce a force on the load mass directed toward the radiating mass. This compensates for the external hydrostatic pressure. While this system avoids the problems of the other techniques, it requires a displacement sensor and control device.

SUMMARY OF THE INVENTION

Accordingly, one object of this invention is to provide a novel pressure release mechanism for an underwater transducer.

Another object of this invention is to provide a pressure release mechanism for a transducer using a saturated vapor pressure.

A further object of this invention is to provide a pressure release mechanism including a heating element for increasing the vapor pressure in the mechanism.

A still further object of this invention is to provide a pressure release mechanism for an acoustic underwater transducer using a heating element to increase the saturated vapor pressure of a fluid having a high critical pressure.

Briefly, these and other objects of the invention are achieved by providing a heating device in a volume of vaporizable liquid. As the liquid is heated, the vapor pressure increases and acts to release the ambient hydrostatic pressure on the transducer. The heater may be controlled in relation to the external pressure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
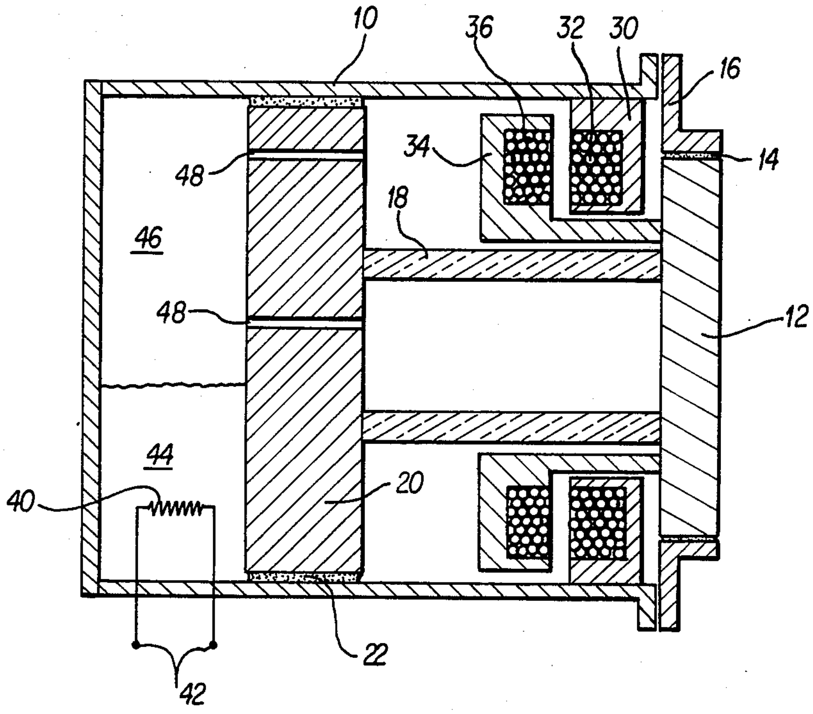
FIG. 1 is a cross-sectional view of the present invention.

Referring now to the drawings, wherein like reference numerals designate identical or corresponding parts throughout the several views, and more particularly to FIG. 1 thereof, wherein the invention is shown as including a watertight housing 10 having one open end which is closed by a radiating end mass 12. The end mass is supported by a ring flange 16 to which it is joined by a waterproof adhesive such as vulcanized rubber or epoxy. The ring flange may be bolted (not shown) to the housing or attached in any other fashion. A cylindrical ceramic transducer 18 is supported by the end mass by means of any suitable fastening means, such as by threading the end of the transducer into a mating opening in the end mass.

As is shown in the art, when the transducer has an electrical signal applied thereto, it contracts and elongates, which in turn vibrates the end mass. In order to cause the full motion of the transducer to be applied to the end mass 12, it is necessary to hold the other end the transducer fixed. A large non-radiating backing mass 20 is provided for this purpose. The mass is affixed to the housing by means of adhesive 22 which may be similar to adhesive 14.

An annular support 30 is affixed to the inside of the housing and contains an annular recess containing coil 32. The face of the coil is directed rearwardly. A second annular support 34 is carried by the radiating mass 12 and also carries a coil 36 in a recess facing forward. This arrangement of coils is designed to partially provide a pressure release system as described in U.S. Pat. No. 3,790,928. The present invention may be used to supplement this coil system or used without these coils.

A volume of liquid 44 is contained between the backing mass and the housing. A heating element 40 is present in the liquid and connected to a source of electrical power through leads 42. Above the surface of the liquid is a volume 46 filled with vapor from the liquid. Passages 48 carry vapor from the volume 46 to the spaces on the other side of the backing mass. While the liquid is shown as being in contact with the backing mass, it is actually preferable that a compartment separate from the mass be used to prevent coupling of the mass with the housing. The compartment could also be outside the housing if connected by an open vapor path.

In operation, when the transducer descends to great depths, the external hydrostaic pressure increases and the temperature decreases. Since the housing is essentially rigid, the total volume of the housing remains a constant even when the external pressure increases. However, since the housing will conduct heat, the internal temperature will also decrease and eventually become equal to the external temperature if no other steps are taken. The internal pressure then decreases since the vapor will start to condense, decreasing the volume 46 of vapor and increasing the volume 44 of liquid, but not by the same amounts. (A large amount of vapor produces a small amount of liquid.) The decrease in internal pressure in conjunction with the increase in external pressure causes the transducer to be compressed and lose efficiency.

In order to overcome this problem, the heating element is connected to a power source, causing the liquid to increase in temperature. As it warms up, more vapor is produced, increasing the internal pressure and effecting a pressure release of the transducer as the internal pressure equals the outside pressure. Since some heat is still lost to the outside, heat may be continually added to the liquid so that a constant temperature and hence constant pressure is achieved. The amount of heat needed to reach this equilibrium varies with the internal pressure desired. Hence the amount of heat may be adjusted so that the internal pressure equals the external pressure, no matter to what depth the mechanism is lowered.

While the mechanism Will work within a range of values of the relative amounts of liquid and vapor and the type of liquid, it is possible to maximize its performance by an appropriate choice of these variables. Since the system is closed, the initial choice of the quality of the fluid (defined as the ratio of the volume of liquid to the total volume) determines how it reacts throughout the operating cycle. Ideally the quality should approach zero as the critical point is reached. That is, the total volume of the housing should equal the critical specific volume of the fluid. When this occurs, the critical point will be reached when the critical pressure is approached. A deviation in this quality value in either direction will result in an intersection of the saturation curve at a pressure lower than the critical pressure.

Figure 2:
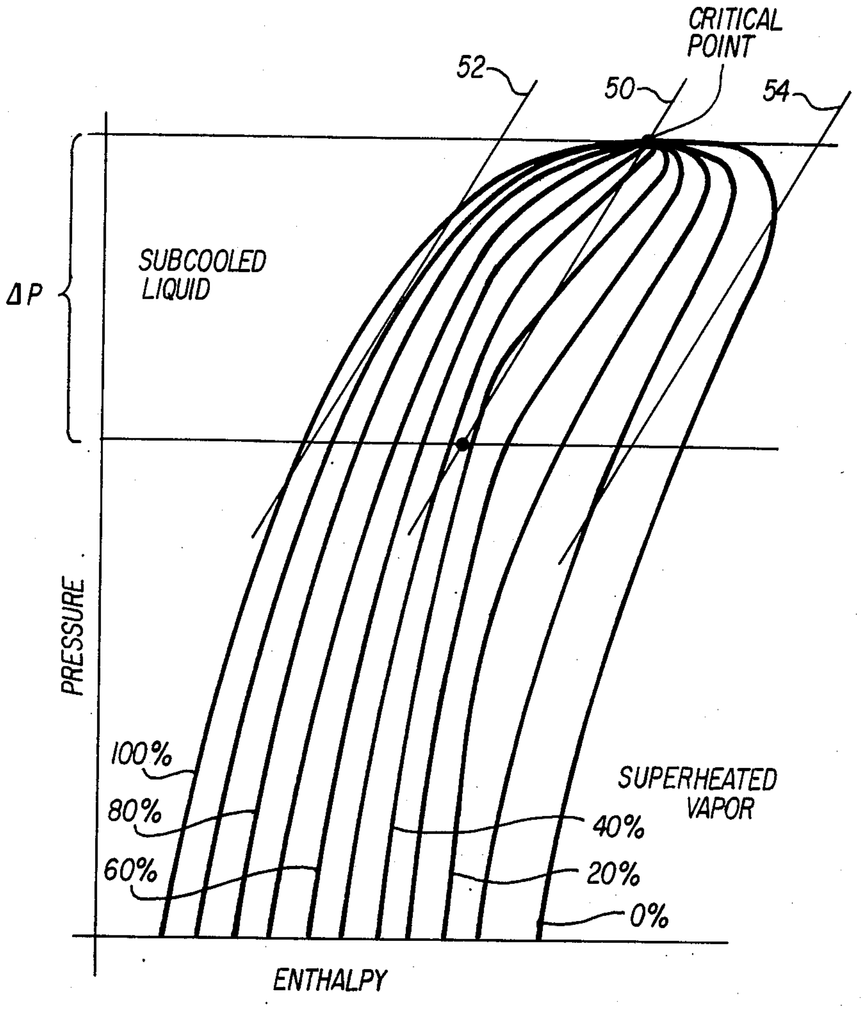
FIG. 2 is a graph showing the relation of pressure and enthalpy in the present invention.

This is more easily seen from FIG. 2, which shows a graph of the pressure versus the enthalpy (heat) of the fluid in the system. At the left side of the graph, the fluid is essentially all liquid. At the right side, it is essentially all vapor. The eleven curves in the center indicate in 10% increments the quality of the fluid at various points of pressure and heat. The curves converge to a critical point at the top of the graph which has the maximum pressure value. Lines 50, 52 and 54 represent curves of constant volume. The line 50 represents the ideal circumstance noted above where the final pressure occurs at the critical point. Other lines such as 52 and 54 intersect the curve at points having pressure values lower than the critical point pressure and hence are less favored. If line 52 were followed, there would be a liquid filled housing at elevated pressure. If line 54 were followed, there would be a vapor filled housing at elevated pressure. In the former, the transducer may become coupled to the housing. In the latter, increases in internal pressure becomes more difficult since heat is used to superheat the vapor rather than to vaporize the liquid.

Care should be used in selecting the fluid for this application. Those fluids which have critical points in the pressure range at which the transducer is to be used will exhibit relatively high vapor densities and will allow a high degree of coupling between the transducer and the housing. The problem, then, reduces to choosing the fluid to be used in the liquid-vapor system with as high a critical pressure as possible relative to the designed operating pressure of the transducer. It is adequate that the fluid pressure be within the saturation curve (FIG. 2) and the final pressure be equal to or greater than the design operating temperature, even if it is less than the optimal critical pressure.

The initial quality of the fluid may be determined from FIG. 2. Choosing a constant volume that passes through the critical point (i.e. line 50), the line is followed back a distance $\Delta P$ which represents the operating range of the transducer. The intersection of the line with this lower pressure will indicate the initial quality of the fluid and the intial pressure value.

It should be noted that some local condensation of the vapor may occur due to local temperature gradients within the housing. This is of no consequence as long as it is not allowed to collect so that coupling occurs.

In returning the device to lesser depths, temperature equalization will require more time since the heat must escape to the ambient. The transducer can be returned to the surface only as rapidly as temperature equalization will allow.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A pressure release mechanism for a transducer, comprising:

- a waterproof housing;
- a radiating mass mounted at one end of said housing;
- a backing mass mounted within said housing;
- a transducer element mounted on said radiating mass and said backing mass for applying a displacement to said radiating mass;
- a quantity of fluid filling any open space within said housing, said quantity of fluid being partly in the liquid state and partly in the vapor state;
- a heating means within said housing in contact with said fluid in the liquid state for adding heat to said fluid in the liquid state and changing said fluid to the vapor state;
- wherein the pressure of said vapor in said housing increases to balance pressure on the transducer external to said housing.

2. The mechanism according to claim 1, wherein the transducer is an underwater acoustic transducer.

3. The mechanism according to claim 1, wherein said backing mass contains passages to allow said fluid in said vapor state to pass therethrough.

4. The mechanism according to claim 1 further comprising:

- a first annular housing mounted on said housing and containing a first coil;
- a second annular housing mounted on said radiating mass and containing a second coil;
- wherein electrical current flowing through said coils causes a force on said backing mass to partially release any pressure on the transducer from outside said housing.

5. The mechanism according to claim 1 wherein said heating means is controlled in accordance with the depth at which the transducer is operating.

6. The mechanism according to claim 1 wherein said fluid has a high critical pressure relative to the design pressure of the transducer.

7. The mechanism according to claim 1 wherein said quantity of fluid is such that the total volume of the housing equals the critical specific volume of the fluid.

8. The mechanism according to claim 1 wherein said heating means is comprised of an electrical resistance heating element.

9. A pressure release mechanism for an underwater acoustic transducer, comprising:

a waterproof housing;

a radiating mass mounted at one end of said housing;

a backing mass mounted within said housing;

a transducer element mounted on said radiating mass and said backing mass for applying a displacement to said radiating mass;

a quantity of fluid filling any open space within said housing, said quantity of fluid being partly in the liquid state and partly in the vapor state;

a heating means within said housing in contact with said fluid in the liquid state for adding heat to said fluid in the liquid state and changing said fluid to the vapor state;

wherein the pressure of said vapor in said housing increases to balance any ambient hydrostatic pressure on the transducer external to said housing;

wherein said backing mass contains passages to allow said fluid in said vapor state to pass therethrough;

wherein said heating means is controlled in accordance with the depth at which the transducer is operating;

wherein said fluid has a high critical pressure relative to the design pressure of the transducer; and wherein said quantity of fluid is such that the total volume of the housing equals the critical specific volume of the fluid.

10. The mechanism according to claim 9 wherein said heating means is comprised of an electrical resistance heating element.

* * * * *